//

US009166574B2

(12) United States Patent
Abramzon

(10) Patent No.: US 9,166,574 B2
(45) Date of Patent: Oct. 20, 2015

(54) APPARATUS AND METHOD FOR PROVIDING TIMING ADJUSTMENT OF INPUT SIGNAL

(75) Inventor: Valentin Abramzon, Palo Alto, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 13/994,939

(22) PCT Filed: Dec. 17, 2010

(86) PCT No.: PCT/US2010/061032
§ 371 (c)(1),
(2), (4) Date: Sep. 3, 2013

(87) PCT Pub. No.: WO2012/082140
PCT Pub. Date: Jun. 21, 2012

(65) Prior Publication Data
US 2013/0335130 A1   Dec. 19, 2013

(51) Int. Cl.
*H03K 5/13* (2014.01)
*H03K 5/06* (2006.01)
(Continued)

(52) U.S. Cl.
CPC .. *H03K 5/06* (2013.01); *H03K 5/14* (2013.01); *H03M 1/682* (2013.01); *H03K 5/133* (2013.01); *H03K 2005/00026* (2013.01); *H03M 1/82* (2013.01)

(58) Field of Classification Search
CPC ........ H03K 5/133; H03K 5/131; H03K 5/132
USPC .......................................... 327/276, 277, 284
See application file for complete search history.

(56) References Cited

U.S. PATENT DOCUMENTS 5,489,864 A    2/1996  Ashuri
5,703,838 A   12/1997  Gorbics et al.
(Continued)

FOREIGN PATENT DOCUMENTS

JP    11177399    12/1997
JP     1168364     6/1999
(Continued)

OTHER PUBLICATIONS

Office Action mailed Jun. 13, 2014 in Japanese Patent Application No. 2013-544441.
(Continued)

*Primary Examiner* — John Poos

(57) ABSTRACT

An apparatus for providing time adjustment of an input signal includes a coarse timing digital-to-analog converter (DAC), a replica delay element and an interpolator. The coarse timing DAC has multiple delay settings for providing a coarse timing adjustment of the input signal, and outputs a first delayed signal by delaying the input signal by a first delay time corresponding to a selected setting of the multiple delay settings. The replica delay element receives the first delayed signal from the coarse timing DAC and outputs a second delayed signal by delaying the first delayed signal by a predetermined second delay time. The interpolator blends either the input signal and the first delayed signal or the first delayed signal and the second delayed signal for providing a fine timing adjustment of the input signal, and outputs a timing adjusted output signal including the coarse timing adjustment and the fine timing adjustment.

17 Claims, 10 Drawing Sheets

(51) Int. Cl.
*H03K 5/14* (2014.01)
*H03M 1/68* (2006.01)
*H03M 1/82* (2006.01)
*H03K 5/00* (2006.01)

(56) References Cited

U.S. PATENT DOCUMENTS

| | | |
|---|---|---|
| 6,169,436 B1 | 1/2001 | Marbot |
| 6,269,060 B1 | 7/2001 | Harvey et al. |
| 6,356,132 B1 * | 3/2002 | Mastrocola et al. .......... 327/276 |
| 6,396,358 B1 * | 5/2002 | Poss et al. ...................... 331/57 |
| 6,795,931 B1 | 9/2004 | LaBerge |
| 6,970,122 B1 * | 11/2005 | Yilmaz et al. ................. 341/145 |
| 8,248,287 B2 * | 8/2012 | Zhao et al. ..................... 341/144 |
| 2008/0100356 A1 | 5/2008 | Lee |
| 2010/0102860 A1 | 4/2010 | Kim |
| 2010/0182058 A1 | 7/2010 | Gomm |
| 2010/0226188 A1 | 9/2010 | Kim et al. |
| 2011/0199128 A1 * | 8/2011 | Turner ......................... 327/106 |

FOREIGN PATENT DOCUMENTS

| | | |
|---|---|---|
| JP | 11168364 | 6/1999 |
| JP | 2001024488 | 1/2001 |
| JP | 2007243735 | 9/2007 |
| JP | 2010050529 | 3/2010 |

OTHER PUBLICATIONS

Office Action mailed Jul. 24, 2014 in German Patent Application No. 112010006025.8.
Office Action mailed Dec. 12, 2014 in Japanese Patent Application No. 2013-544441(Unofficial/Non-certified translation provided by foreign agent included).
Notice of Allowance mailed Apr. 7, 2015 in Japanese Patent Application No. 2013-544441(Unofficial/Non-certified translation provided by foreign agent included).

* cited by examiner derlüf # APPARATUS AND METHOD FOR PROVIDING TIMING ADJUSTMENT OF INPUT SIGNAL The present application is a national stage filing under 35 U.S.C. §363 of International Patent Application No. PCT/US10/61032 filed on Dec. 17, 2010, naming Valentin Abramzon as inventor. Priority under 35 U.S.C. §365(c) is claimed from International Patent Application No. PCT/US10/61032, and the entire disclosure of International Patent Application No. PCT/US10/61032 is specifically incorporated herein by reference.

BACKGROUND

Digital-to-time converters, referred to as timing digital-to-analog converters (timing DACs), may be used to adjust timing of events in integrated circuits, for example. Timing DACs typically include circuits that provide coarse timing adjustments and fine timing adjustments, respectively, in order to obtain the desired timing adjustments.

FIGS. 1A and 1B are block diagrams illustrating known circuits for providing coarse timing adjustments. Generally, coarse timing adjustments are accomplished by switching delay elements, such as complementary metal-oxide-semiconductor (CMOS) gates, into or out of a delay path using multiplexers.

FIG. 1A is a block diagram depicting a known coarse timing DAC 101, which multiplexes between taps of a CMOS delay chain, including delay elements 111-113 and dummy load 114. However, a large number of taps requires use of a wide multiplexer or a multiplexer tree, shown by multiplexers 121-123, controllable by coarse adjustment control bit cAdj<0>, and multiplexer 130, controllable by coarse adjustment control bits cAdj<2:1>. The multiplexer tree adds non-trivial delay.

FIG. 1B is a block diagram depicting another known coarse timing DAC 102, having a trombone structure that uses delays of multiplexers 141-144 as part of the delay line, thus decreasing the minimum delay time. The delay of the coarse timing DAC 102 is determined in response to a binary coarse adjustment control word cAdj<1:0> and corresponding coarse select signals cSel3-cSel0. The coarse select signals cSel3-cSel0 may be one-hot coded, for example, which means that only one bit of the coarse select signals cSel3-cSel0 is set to "1" at a time, and the remaining bits of the coarse select signals cSel3-cSel0 are set to "0", e.g., 0001, 0010, 0100, and 1000. A binary to one-hot decoder 145 converts the binary coarse adjustment control word cAdj<1:0> to one-hot coded coarse select signals cSel3-cSel0. The coarse select signals cSel3-cSel0 determine the number of multiplexers 141-144 that input signal In traverses before it arrives at the output Out. Whichever coarse select signal cSelN that is set to "1" forces the corresponding multiplexer 141-144 to select the input signal In. For example, Table 1 shows the multiplexers traversed by the input signal In in response to a binary coarse adjustment control word and corresponding coarse select signals cSel3-cSel0.

TABLE 1

| Decimal number | Binary coarse adjustment control word cAdj<1:0> | Coarse select signals cSel3 ... cSel0 | Multiplexers traversed by input signal In |
|---|---|---|---|
| 0 | 00 | 0001 | 141 |
| 1 | 01 | 0010 | 142→141 |
| 2 | 10 | 0100 | 143→142→141 |
| 3 | 11 | 1000 | 144→143→142→141 |

The coarse timing DAC 102 effectively limits the size of the delay time steps to the relatively large delay of a 2:1 multiplexer. In comparison, the coarse timing DAC 101 of FIG. 1A can be designed with delay time steps of two inverter delays (for a single-ended delay chain) or even one inverter delay (for a pseudo-differential delay chain).

FIGS. 2A and 2B are block diagrams illustrating known circuits for providing fine timing adjustments. FIG. 2A is a block diagram depicting known fine timing DAC 201, including delay elements 211 and 212, which may be CMOS inverters, for example. A variable load capacitor 213 is connected from a node between the delay elements 211 and 212 to ground. Thus, the fine timing DAC 201 adjusts time delay by varying the load capacitor 213 of the delay element 211.

FIG. 2B is a block diagram depicting another known fine timing DAC 202, which includes interpolator 250 and delay element 261. The interpolator 250 includes multiplexers 251-253. Each of the multiplexers 251-253 receives the input signal In directly and delayed signal D via delay element 261 in order to blend them according to a variable ratio between the two signals, determined in response to fine adjustment control word fAdj.

In applications requiring a wide range of time adjustment, as well as fine step size, a coarse timing DAC (e.g., shown in FIG. 1A or 1B) and a fine timing DAC (e.g., shown in FIG. 2A or 2B) may be cascaded to form a timing DAC, in which the range of the fine timing adjustment covers at least a LSB of the coarse timing adjustment circuit to avoid dead zones. However, cascading coarse and fine timing DACs is problematic when minimum delay time is critical because the minimum delay time of the resulting timing DAC is the sum of the respective minimum delay times of the coarse and fine timing DACs. Using a multiplexer tree-based structure, such as that shown in FIG. 1A, aggravates the problem because the structure has a large minimum delay time itself. Also, the relatively large LSB of a trombone structure, such as that shown in FIG. 1B, makes it difficult to the design a fine timing adjustment circuit with a sufficiently wide range.

SUMMARY

In a representative embodiment, an apparatus for providing time adjustment of an input signal comprises a coarse timing digital-to-analog converter (DAC) having a plurality of delay settings for providing a coarse timing adjustment of the input signal, the coarse timing DAC being configured to receive the input signal and to output a first delayed signal. The apparatus comprises a replica delay element configured to receive the first delayed signal from the coarse timing DAC and to provide a second delayed signal; and an interpolator configured to blend either the input signal and the first delayed signal or the first delayed signal and the second delayed signal to provide a fine timing adjustment of the input signal, wherein the interpolator is configured to provide a timing adjusted output signal comprising the coarse timing adjustment and the fine timing adjustment.

In accordance with another representative embodiment, a method for providing time adjustment of an input signal comprises: delaying the input signal by a first delay time to provide a first delayed signal including a coarse timing adjustment of the input signal, the first delay time being selectable from among a plurality of delay settings; delaying the first delayed signal by a predetermined second delay time to provide a second delayed signal; interpolating between either the input signal and the first delayed signal or between the first delayed signal and the second delayed signal to provide a fine timing adjustment of the input signal; and outputting a timing adjusted output signal including the coarse timing adjustment and the fine timing adjustment.

In accordance with another representative embodiment, an apparatus for providing time adjustment of an input signal comprises: a coarse timing digital-to-analog converter (DAC) having predetermined minimum delay setting and a plurality of intermediate delay settings, each intermediate delay setting being separated from a previous delay setting by an incremental delay time. The coarse timing DAC is configured to receive the input signal and to output a first delayed signal by delaying the input signal by a coarse delay time corresponding to a selected delay comprising one of the minimum delay setting or the minimum delay setting plus at least one of the plurality of intermediate delay settings. The apparatus comprises a replica delay element configured to receive the first delayed signal from the coarse timing DAC and to output a second delayed signal by delaying the first delayed signal by the incremental delay time; and an interpolator configured to interpolate between either the input signal and the first delayed signal or between the first delayed signal and the second delayed signal to provide a fine timing adjustment of the input signal, the interpolator outputting a timing adjusted output signal including the coarse timing adjustment and the fine timing adjustment.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, various representative embodiments provide a timing DAC optimized for short minimum delay and wide tuning range. For example, the timing DAC may include a trombone structure optimized for short LSB for coarse timing adjustments, combined with an interpolator for fine timing adjustments with minimal delay overhead. The various embodiments thus provide overall timing adjustment with a short minimum delay (e.g., at a minimum delay setting), while still enabling a wide tuning range with a small LSB.

Figure 3:
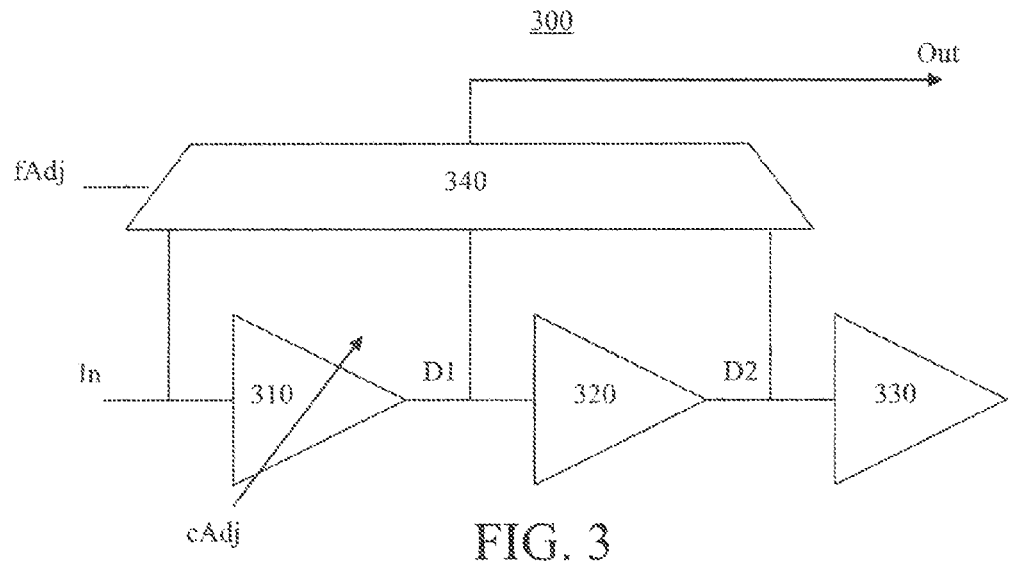
FIG. 3 is a block diagram illustrating a timing DAC, according to a representative embodiment.

FIG. 3 is a block diagram illustrating a timing DAC, according to a representative embodiment.

Referring to FIG. 3, timing DAC 300 includes coarse timing DAC 310, replica delay element 320 and dummy load 330 connected to interpolator 340. Generally, the coarse timing DAC 310 provides coarse timing adjustment of input signal In, and the interpolator 340 provides fine timing adjustment of input signal In, and provides timing adjusted output signal Out. The coarse and fine timing adjustments are performed in response to a binary coarse adjustment control word (cAdj) and a binary fine adjustment control word (fAdj), respectively, which are numbers (represented by multiple bits) that control the overall delay of the timing DAC 300.

The interpolator 340 has multiple blend settings, which may be selected by a user, for example. In the depicted embodiment, the interpolator 340 has three inputs and thus two available blend settings, although additional inputs and blend settings may be included without departing from the scope of the present teachings. In particular, the interpolator 340 has a first input for receiving the input signal In, a second input for receiving a first delayed signal D1 output by the coarse timing DAC 310, and a third input for receiving a second delayed signal D2 output by the replica delay element 320. With three inputs, the interpolator 340 is configured to blend (or interpolate between) either the input signal In and the first delayed signal D1, or to blend (or interpolate between) the first delayed signal D1 and the second delayed signal D2. The timing adjusted output signal Out, which includes the coarse and fine timing adjustments, is output by the interpolator 340.

The delay of the coarse timing DAC 310 is adjustable. For example, in the depicted embodiment, the coarse timing DAC 310 includes multiple predetermined delay settings, enabling the coarse timing DAC 310 to implement time delays within a range from minimum delay time $t_{min}$ corresponding to a minimum delay setting to maximum delay time $t_{min}$ corresponding to a maximum delay setting. The coarse timing DAC 310 may also include one or more intermediate delay settings separated by incremental delay time steps $t_{step}$. The replica delay element 320 generates a delay in the amount of another delay time step $t_{step}$ from first delayed signal D1 to second delayed signal D2. The interpolator 340 also has a corresponding time delay, which is the time required to blend the various pairs of input signals, referred to as blend delay time $t_{blend}$.

Figure 4:
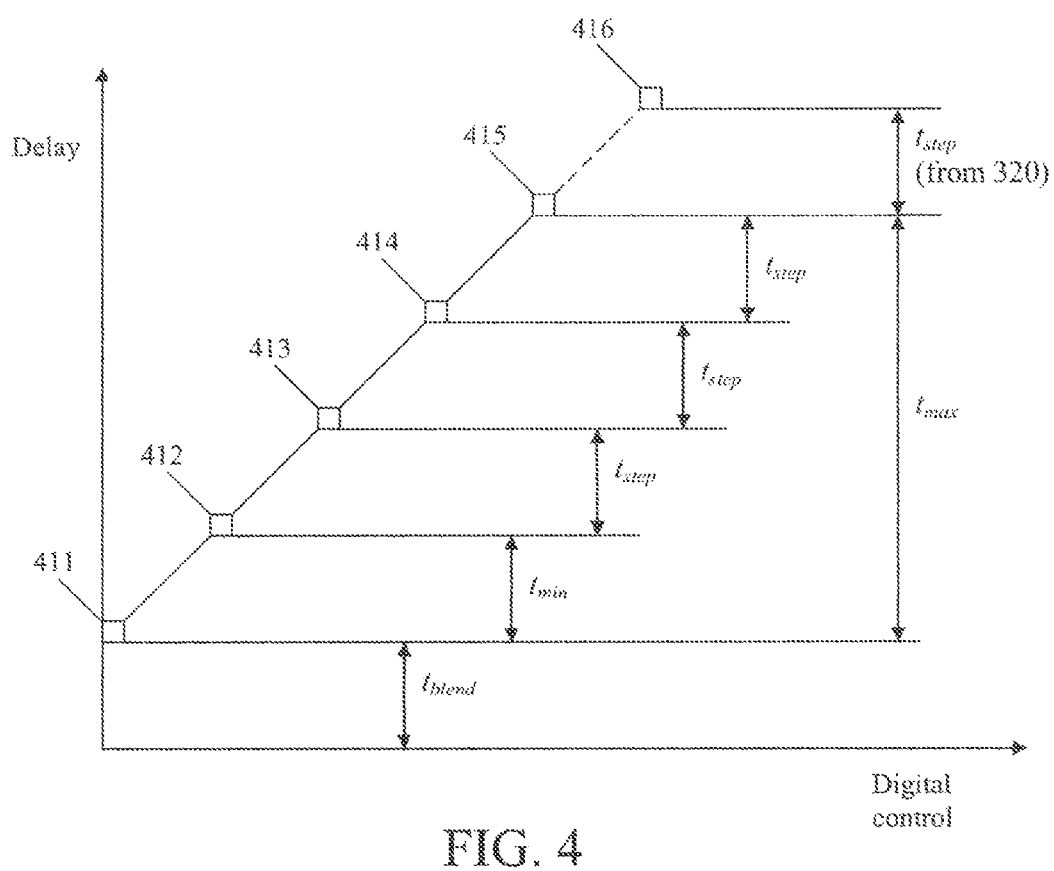
FIG. 4 is a graph showing illustrative delay characteristics of the timing DAC of FIG. 3, according to a representative embodiment.

FIG. 4 is a graph showing an illustrative delay control characteristic of the timing DAC 300, according to a representative embodiment. When the coarse timing DAC 310 is set to its minimum delay $t_{min}$, blending (interpolating) the input signal In and the first delayed signal D1 generates delays between minimum delay 411 and delay 412, while blending (interpolating) the first delayed signal D1 and the second delayed signal D2 generates delays between delay 412 and delay 413. The delays between delay 413 and delay 414 are generated by interpolating between the first and second delayed signals D and D2 when the coarse timing DAC 310 is set to delay $t_{min}+t_{step}$. The delays between delay 414 and delay 415 are generated by interpolating between the first and second delayed signals D1 and D2 when the coarse timing DAC 310 is set to delay $t_{min}+2\cdot t_{step}$. Finally, the delays between delay 415 and delay 416 are generated by interpolating between the first and second delayed signals D1 and D2 when the coarse timing DAC 310 is set to its maximum delay $t_{max}$. In the depicted embodiment, in which the coarse timing DAC 310 has four delay settings, for purposes of illustration, $t_{max}=t_{min}+3\cdot t_{step}$. More or fewer delay time step $t_{step}$ settings may be included without departing from the scope of the present teachings. The lines connecting delays 411-416 (indicated by squares) correspond to an ideal interpolation by the interpolator 340. Illustrative control signals for the coarse timing DAC 310 and the interpolator 340, along with resulting delay ranges, are listed in Table 2.

TABLE 2

| Delay setting of coarse timing DAC 310 | Interpolation setting of interpolator 340 | Resulting range of delays |
|---|---|---|
| $t_{min}$ | Blend input signal In and first delayed signal D1 | $t_{blend}$ to $t_{blend} + t_{min}$ |
| $t_{min}$ | Blend first and second delayed signals D1 and D2 | $t_{blend} + t_{min}$ to $t_{blend} + t_{min} + t_{step}$ |
| $t_{min} + k \cdot t_{step}$ (where k is an integer) | Blend first and second delayed signals D1 and D2 | $t_{blend} + t_{min} + k \cdot t_{step}$ to $t_{blend} + t_{min} + (k+1) \cdot t_{step}$ |

In the depicted embodiment, each of the minimum delay time $t_{min}$ and the delay time step $t_{step}$ must be small enough to allow interpolation by the interpolator 340 between the neighboring settings of the coarse timing DAC 310. If the minimum delay time $t_{min}$ and the delay time steps $t_{step}$ are too large compared to the operating speed of the interpolator 340, the bandwidth of the interpolator 340 must be reduced. For example, the bandwidth of the interpolator 340 may be reduced by loading it with an additional capacitance. Alternatively, the supply voltage of the interpolator 340 may be reduced, or the supply current may be limited. However, artificially lowering the interpolator bandwidth is often undesirable, because it limits the operating speed of the system and makes it more susceptible to noise. Also, to make the transfer characteristic of the timing DAC 300 as linear as possible (e.g., as shown in FIG. 4), the delay time steps $t_{step}$ must be equal to one another, and the minimum delay time $t_{min}$ must be equal to each of the delay time steps $t_{step}$.

Figure 1A:
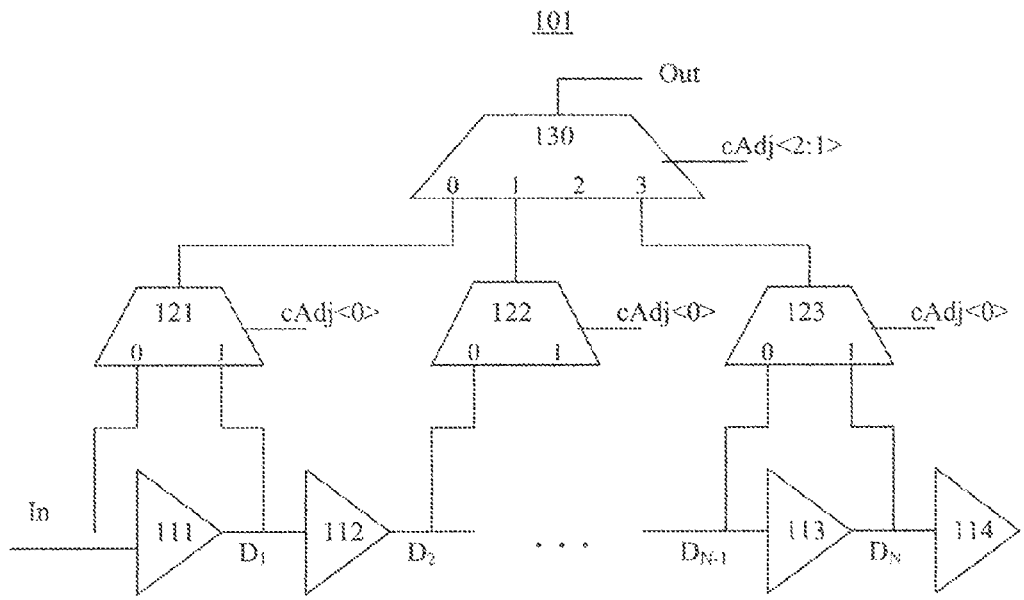
FIGS. 1A and 1B are block diagrams illustrating conventional circuits for providing coarse timing adjustments.
Figure 1B:
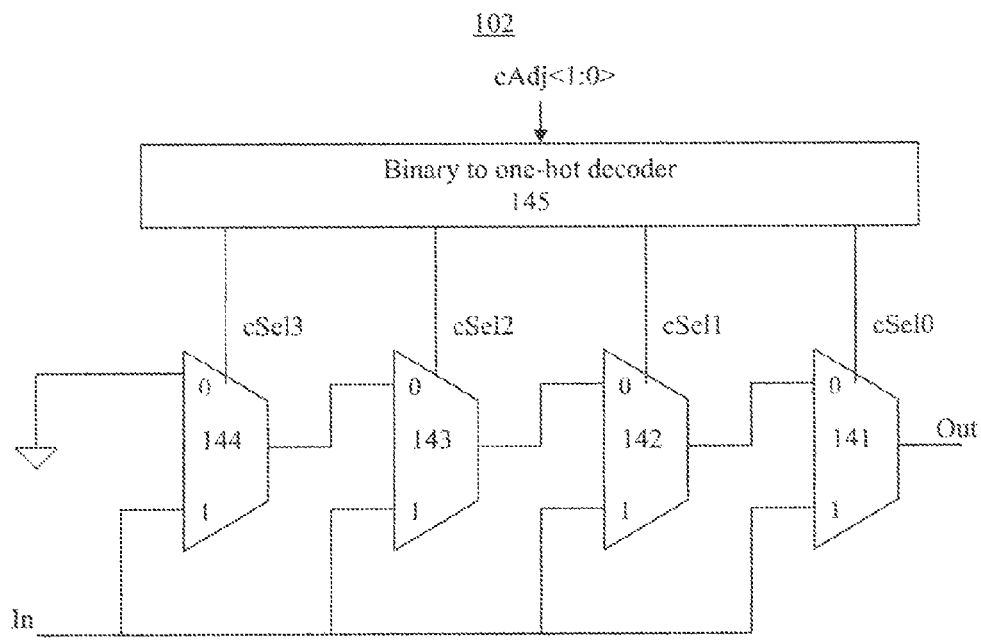
Figure 2A:
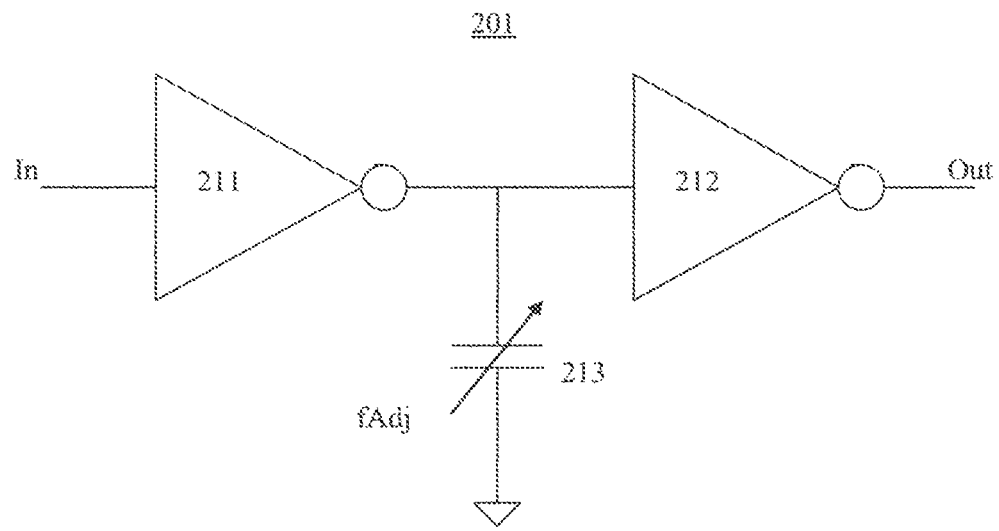
FIGS. 2A and 2B are block diagrams illustrating conventional circuits for providing fine timing adjustments.
Figure 2B:
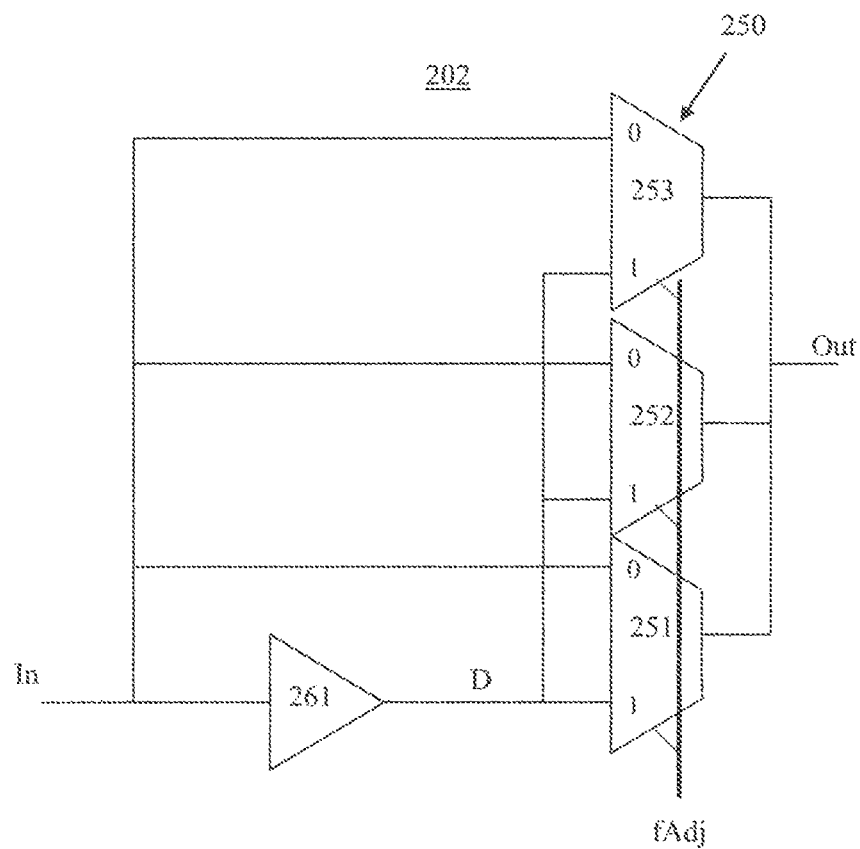

The coarse timing DAC 310 may be implemented in various configurations, without departing from the scope of the present teachings. For example, the coarse timing DAC 310 may be configured as the conventional coarse timing DAC 102, having a trombone structure, shown in FIG. 1B. The coarse timing DAC 102 has a minimum delay time $t_{min}$ equal to delay time $t_{MUX1}$ and a delay time step $t_{step}$ equal to $t_{MUX0}$ of each of the multiplexers, multiplexers 141-144, where delay time $t_{MUX0}$ is the multiplexer delay from input 0 to the multiplexer output and delay time $t_{MUX1}$ is the multiplexer delay from input 1 to the multiplexer output. A two-input multiplexer, such as multiplexers 141-144, can be made symmetrical, such that $t_{MUX}=t_{MUX1}=t_{MUX}$. However, a relatively long delay of a typical non-inverting CMOS multiplexer limits the achievable bandwidth of the interpolator 340 because, generally, the bandwidth of the interpolator 340 must be less than $1/(\text{delay time step } t_{step})=1/(\text{delay time } t_{MUX})$.

In addition, input capacitance of the trombone structure in the coarse timing DAC 102 is proportional to the number of delay stages, and can therefore become quite large for a large number of coarse bits. Also, propagation delay $t_{MUXfall}$ for the falling edge of the output signal of each of the multiplexers 141-144 may be different from propagation delay $t_{MUXrise}$ for the corresponding rising edge, which results in duty cycle distortion (DCD). The DCD accumulates when multiple non-inverting stages are cascaded, e.g., when coarse select signals cSel3 . . . cSel0=1000, and thus the input signal In propagates through all of the multiplexers 141-144. Generally, the more multiplexers are there in the signal path, the worse DCD becomes.

Figure 5:
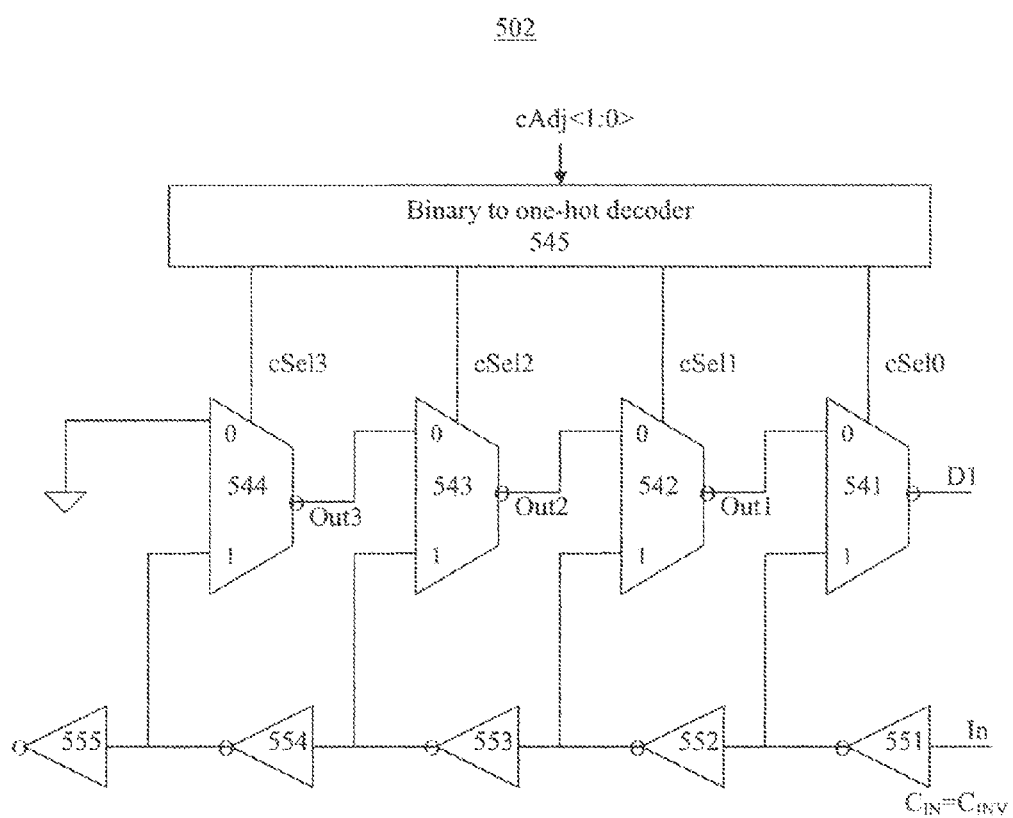
FIG. 5 is a block diagram illustrating a coarse timing DAC, according to a representative embodiment.
Figure 6:
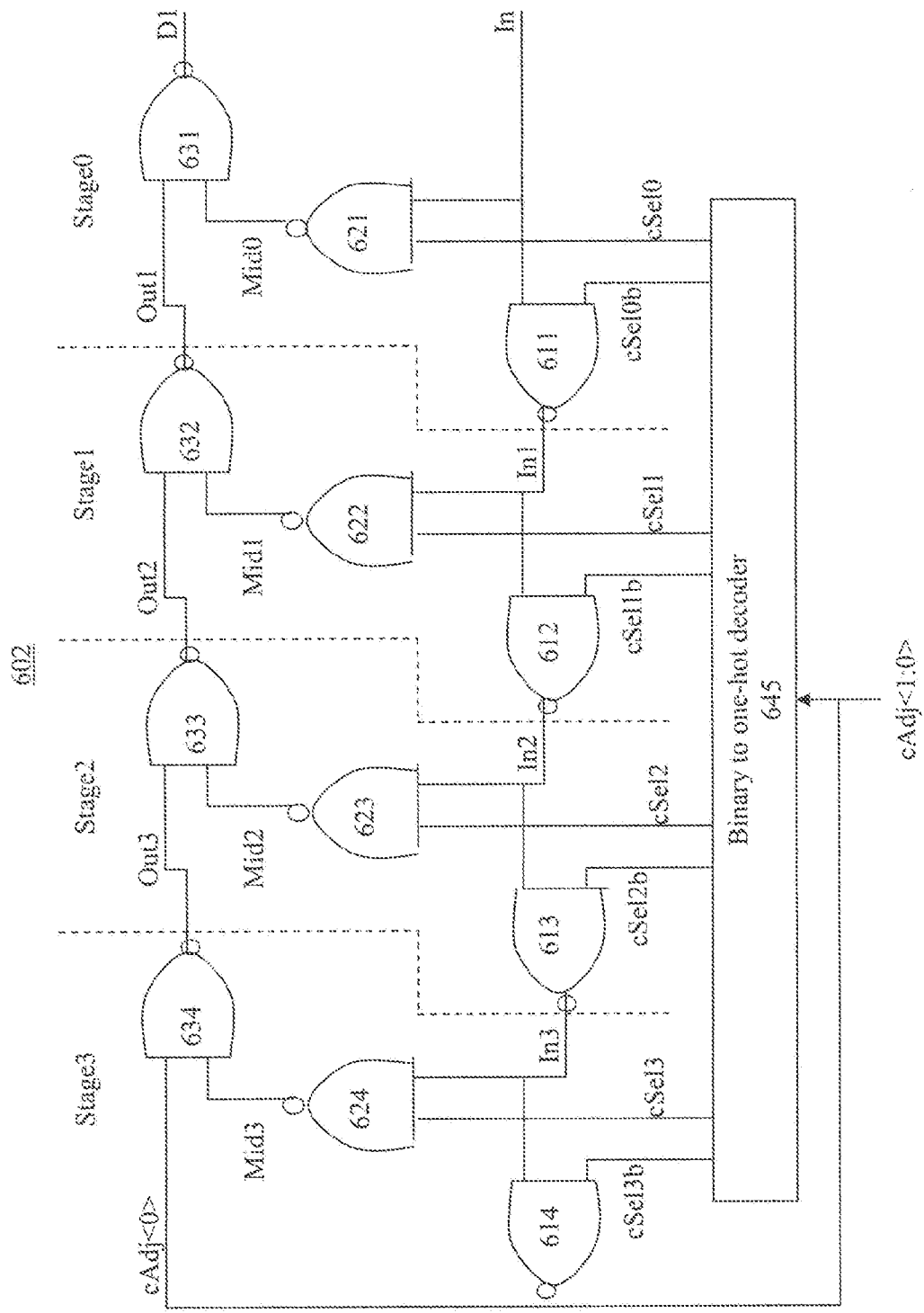
FIG. 6 is a block diagram illustrating a coarse timing DAC, according to an alternative representative embodiment.
Figure 7:
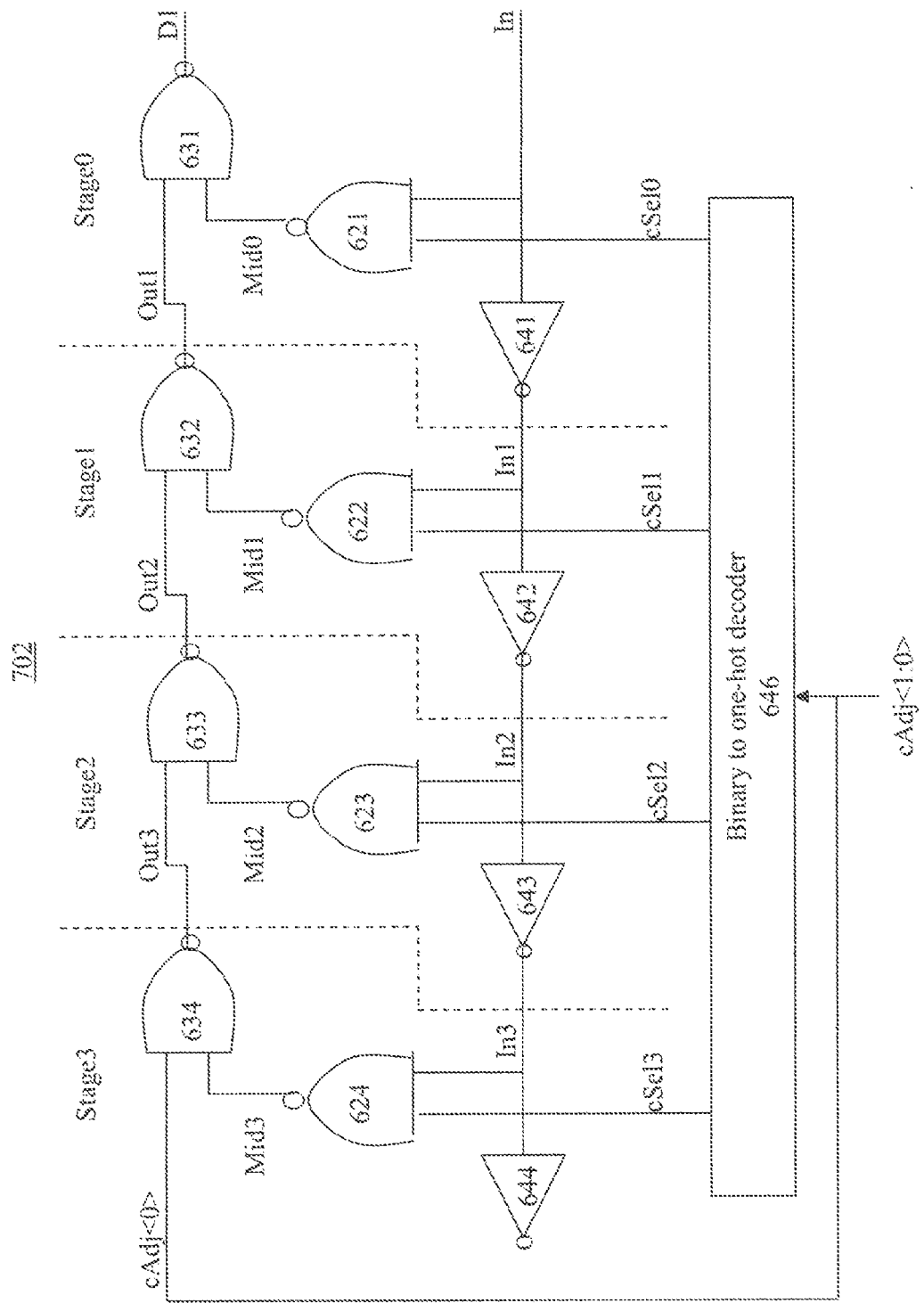
FIG. 7 is a block diagram illustrating a coarse timing DAC, according to an alternative representative embodiment.

FIGS. 5, 6 and 7 are block diagrams showing illustrative coarse timing DACs, which may be implemented as coarse timing DAC 310 shown in FIG. 3, according to representative embodiments.

Referring to FIG. 5, coarse timing DAC 502 includes inverting multiplexers 541-544 and inverters 551-555. This configuration reduces input capacitance and minimizes DCD of the coarse timing DAC 502, as compared to the input capacitance and the DCD of the coarse timing DAC 102 in FIG. 1B, for example. More particularly, the input capacitance $C_{IN}$ of the coarse timing DAC 502 is equal to the input capacitance $C_{INV}$ of only one inverter 551. Also, the DCD of the even stages effectively cancels the DCD of the odd stages, and thus the DCD of the coarse timing DAC 502 does not accumulate, where "stage" refers to an inverting multiplexer 54n combined with a corresponding inverter 55n, where n is from 1 to 4. For example, when coarse select signals cSel3 . . . cSel0=0010, the input signal In traverses the inverters 551-552 and the inverting multiplexers 542-541. Therefore, the DCD of the second inverter (inverter 552) cancels the DCD of the first inverter (inverter 551), and the DCD of the second inverting multiplexer 541 cancels the DCD of the first inverting multiplexer 542. Still, the falling edge delays $t_{fall}$ must be equalized with the rising edge delays $t_{rise}$ for all of the gates 541-544 and 551-554 to avoid differential non-linearity (DNL) of the coarse timing DAC 502.

In FIGS. 6 and 7, the multiplexers (e.g., the multiplexers 541-544 shown in FIG. 5) are replaced by NAND gates, which have a lower logical effort than multiplexers and, therefore, shorter delay. Use of the NAND gates shortens the delay time step size of a trombone structure by about 10-20 percent, and thus further facilitates interpolation. Specifically, the delay time step $t_{step}$ of the coarse timing DAC 602 of FIG. 6 is twice the delay of a NAND gate $t_{NAND}$, while the delay time step $t_{step}$ of the coarse timing DAC 702 of FIG. 7 is further shortened to the sum of the delay of an inverter $t_{INV}$ and the delay of a NAND gate $t_{NAND}$. However, the coarse timing DAC 702 has a minimum delay time $t_{min}$ that is not equal to the delay time step $t_{step}$, which will result in DNL if the coarse timing DAC 702 is used as the coarse timing DAC 310 in FIG. 3. Referring to FIG. 6, coarse timing DAC 602 includes NAND gates 611-614, 621-624 and 631-634 arranged in four stages, Stage0-Stage3, respectively. Stage0 includes NAND gate 611, 621 and 631. NAND gate 621 receives coarse select signal cSel0 and the input signal In of the coarse timing DAC 602 as inputs, and NAND gate 611 receives input signal In and coarse select signal cSel0b as inputs, where coarse select signal cSel0b is the inverse of the coarse select signal cSel0. NAND gate 631 receives the output Mid0 of NAND gate 621 and the output Out 1 of the adjacent stage (Stage 1) as inputs, and outputs the output of the coarse timing DAC 602 (first delayed signal D1). Stage1 includes NAND gates 612, 622 and 632. NAND gate 622 receives coarse select signal cSel1 and the output In1 of preceding NAND gate 611 as inputs, and NAND gate 612 receives coarse select signal cSel1b and the output In1 as inputs, where coarse select signal cSel1b is the inverse of the coarse select signal cSel1. NAND gate 632 receives the output Mid1 of NAND gate 622 and the output Out2 of the adjacent stage (Stage 2) as inputs, and outputs Out1 to Stage0. More generally, Stage2 includes NAND gates 613, 623 and 633, receives output In2 from the preceding stage Stage1, receives coarse select signals cSel2 and cSel2b (the inverse of coarse select signal cSel2), and outputs Out2 of Stage2. Likewise, Stage3 includes NAND gates 614, 624 and 634, receives output In3 from the preceding stage Stage2, receives coarse select signals cSel3 and cSel3b (the inverse of coarse select signal cSel3), and outputs Out3 of Stage3. However, NAND gate 634 does not receive output from an adjacent stage since it is the end stage, in the depicted illustrative configuration. Rather, NAND gate 634 receives the output Mid3 of NAND gate 624 and the least significant bit (LSB) cAdj<0> of the coarse adjustment control word cAdj<1:0> as inputs.

The coarse select signals cSel3-cSel0 may be one-hot coded, for example, and provided by binary to one-hot decoder 645. As stated above, coarse signals cSel3b-cSel0b are inverses of coarse select signals cSel3-cSel0, respectively.

Referring to FIG. 7, coarse timing DAC 702 includes NAND gates 621-624 and 631-634, arranged as discussed above with reference to FIG. 6. However, in place of NAND gates 611-616, DAC 604 includes inverters 641-644. The NAND gates 621-624 and 631-634 and inverters 641-644 are arranged in the four stages, Stage0-Stage3, respectively. That is, Stage0 includes NAND gates 621, 631 and inverter 641, such that NAND gate 621 receives the input In and coarse select signal cSel0; Stage1 includes NAND gates 622, 632 and inverter 642, such that NAND gate 622 receives the output 1 nl from the preceding inverter 641 and coarse select signal cSel1; Stage2 includes NAND gates 623, 633 and inverter 643, such that NAND gate 623 receives the output In2 from the preceding inverter 642 and coarse select signal cSel2; and Stage3 includes NAND gates 624, 634 and inverter 644, such that NAND gate 624 receives the output In3 from the preceding inverter 643 and coarse select signal cSel3. The remaining connections are substantially the same as discussed above with reference to FIG. 6, and therefore the description will not be repeated.

The coarse select signals cSel3-cSel0 may be one-hot coded, for example, and provided by binary to one-hot decoder 646. Operation of the coarse timing DACs 602 and 702 is described below. Generally, delay elements (e.g., NAND gates and/or inverters) are selectively activated in response to the coarse adjustment control word cAdj<1:0> and the coarse select signals cSel3-cSel0. The input signal In propagates through the bottom row of delay elements (either the NAND gates 611-614 in FIG. 6 or the inverters 641-644 in FIG. 7) to provide outputs In1-In3, which is a series of delayed (In1 and n3 are also inverted) versions of the input signal In. The NAND gates 621-624 select only one of the signals In, In1, In2, and In3, so that only one of the signals Mid0-Mid3 is active. The rest of them are forced to static "1", which allows the active MidN signal to propagate to the output D1 of the coarse timing DAC through the top row of NAND gates. Notably, the total number of signal inversions on the path from In to Out is always even, regardless of the value of the control word cAdj<1:0>. This means that the input signal always arrives at the output D1 not inverted, only delayed.

Suppose, for example, that the coarse adjustment control word cAdj<1:0>=10 (cAdj<1>=1 and cAdj<0>=0), which is decoded to coarse select signals cSel3 ... cSel0=0100 (only coarse select signal cSel2 is "1"). This allows NAND gate 623 to pass the inverted and delayed version of signal In2 to NAND gate 623 output Mid2. To allow only the selected NAND gate 623 output Mid2 to propagate through NAND gates 633-631 and reach the output for first delayed signal D1, the other outputs Mid3, Mid1 and Mid0 of NAND gates 624, 622 and 621, respectively, are forced to "1" by setting corresponding coarse select signals cSel3, cSel1 and cSel0 to "0". The input Out3 to NAND gate 633 also has to be forced to "1" by feeding LSB (cAdj<0>) of the coarse adjustment control word cAdj<1:0> into the free input of the NAND gate 634 of the last stage (Stage 3). Finally, in case of coarse timing DAC 602, in particular, coarse select signal cSel2b=0 also disables (forces to static "1" or static "0" values) all signal nodes to the left of NAND gate 613, thereby saving power.

Figure 8A:
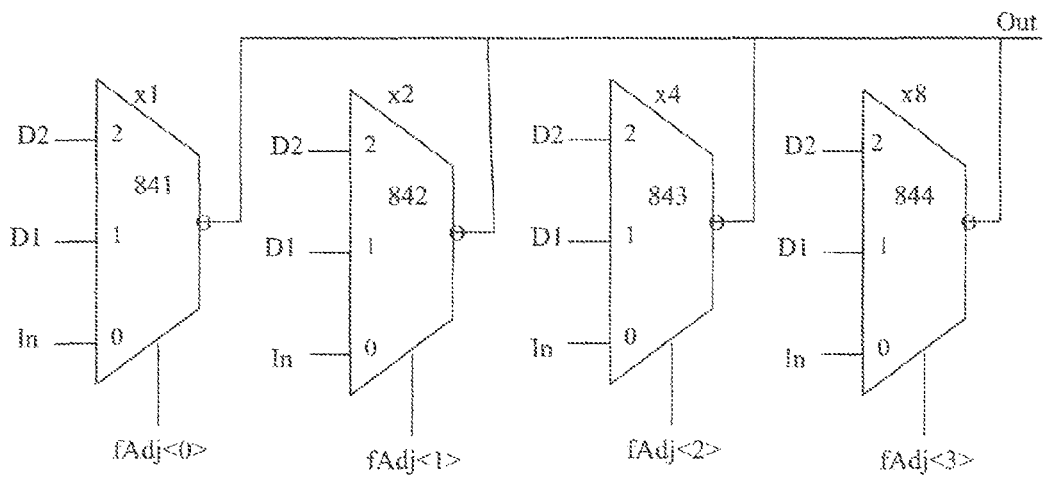
FIG. 8A is a block diagram illustrating a fine timing DAC, according to a representative embodiment.

FIG. 8A is a block diagram illustrating a fine timing DAC that may be incorporated in the timing DAC of FIG. 3, according to a representative embodiment.

Referring to FIG. 8A, the fine timing DAC is implemented as a three-input interpolator 340. In the depicted embodiment, the interpolator 340 includes four inverting multiplexers 841-844 with binary-weighted or unary-weighted drive strengths, which are blended by shorting the respective outputs together. In various embodiments, more or fewer inverting multiplexers may be included without departing from the scope of the present teachings.

Each of the inverting multiplexers 841-844 receive the input signal In, the first delayed signal D1 from the coarse timing DAC 310, and the second delayed signal D2 from the replica delay element 320 to enable blending pairs of signals according to a variable ratio. As discussed above, the interpolator 340 blends either the input signal In and the first delayed signal D1, or the first delayed signal D1 and the second delayed signal D2, depending on the selected blend setting, determined in response to fine adjustment control word fAdj <3:0>. The multiplication factors ×1, ×2, ×4, and ×8 corresponding to each of the inverting multiplexers 841-844 indicate the binary-weighted strengths applied to the corresponding inverting multiplexers 841-844. Thus, the inverting multiplexer 842 is twice as strong as the inverting multiplexer 841; the inverting multiplexer 843 is twice as strong as the inverting multiplexer 842; and the inverting multiplexer 844 is twice as strong as the inverting multiplexer 843.

Illustrative fine adjustment control words fAdj <3:0> for the interpolator 340, as shown in FIG. 8A, and corresponding output signals Out, are listed in Table 4. As shown in Table 4, the blended output signal Out is the sum of the selected input of each inverting multiplexers 841-844 (input signal In, first delayed signal D1 or second delayed signal D2) multiplied by the multiplication factor associated with the corresponding inverting multiplexer 841-844.

TABLE 4

| Fine adjustment control word fAdj<3:0> | Interpolate between | Out is the following blend |
| --- | --- | --- |
| 0000 | In and D1 | In · 8 + In · 4 + In · 2 + In · 1 |
| 0001 | | In · 8 + In · 4 + In · 2 + D1 · 1 |
| 0010 | | In · 8 + In · 4 + D1 · 2 + In · 1 |
| 0011 | | In · 8 + In · 4 + D1 · 2 + D1 · 1 |
| ... | | ... |
| 1110 | | D1 · 8 + D1 · 4 + D1 · 2 + In · 1 |
| 1111 | D1 and D2 | D1 · 8 + D1 · 4 + D1 · 2 + D1 · 1 |
| 1112 | | D1 · 8 + D1 · 4 + D1 · 2 + D2 · 1 |
| 1121 | | D1 · 8 + D1 · 4 + D2 · 2 + D1 · 1 |
| 1122 | | D1 · 8 + D1 · 4 + D2 · 2 + D2 · 1 |
| ... | | ... |
| 2222 | | D2 · 8 + D2 · 4 + D2 · 2 + D2 · 1 |

Figure 8B:
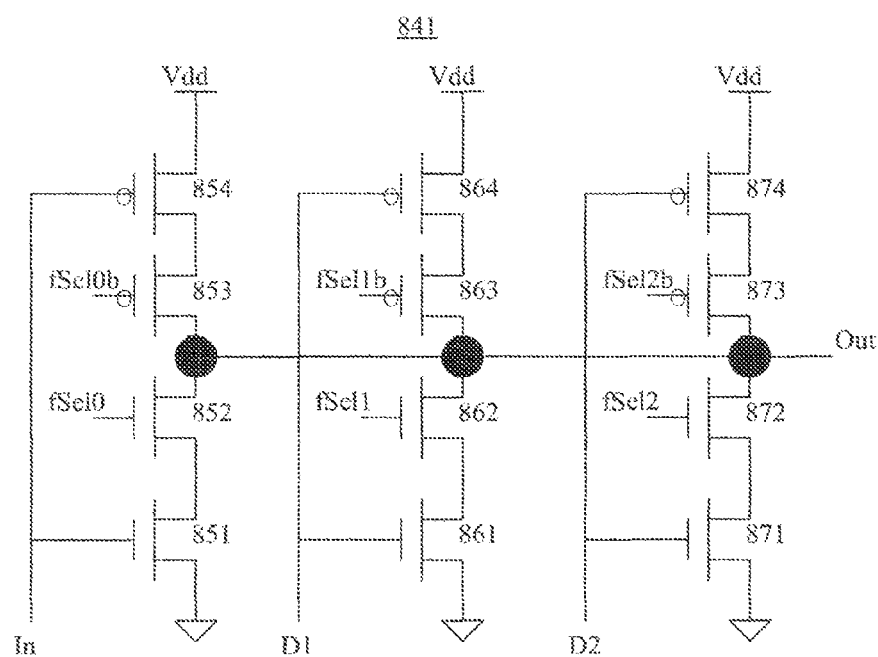
FIG. 8B is a circuit diagram illustrating a multiplexer in the fine timing DAC of FIG. 8A, according to a representative embodiment.

FIG. 8B is a circuit diagram illustrating an inverting multiplexer, such as inverting multiplexer 841, in the interpolator 340 of FIG. 8A, according to a representative embodiment. It is understood that each of the inverting multiplexers 841-844 has the same configuration in the depicted embodiment. Of course, in alternative embodiments, the inverting multiplexers 841-844 may have other configurations without departing from the scope of the present teachings.

Referring to FIG. 8B, the illustrative inverting multiplexer 841 includes three sets of transistors connected in series between supply voltage Vdd and ground Gnd. The first set of transistors includes NMOS transistors 851 and 852 and PMOS transistors 853 and 854. The gates of NMOS transistor 851 and PMOS transistor 854 are connected to the input signal In, the gate of NMOS transistor 852 is connected to the fine select signal fSel0, and the gate of PMOS transistor 853 is connected to the fine select signal fSel0b, where the fine select signal fSel0b is the inverse of the fine select signal fSel0.

The second set of transistors includes NMOS transistors 861 and 862 and PMOS transistors 863 and 864. The gates of NMOS transistor 861 and PMOS transistor 864 are connected to the first delayed signal D1, the gate of NMOS transistor 862 is connected to the fine select signal fSel1, and the gate of PMOS transistor 863 is connected to the fine select signal fSel1b, where fine select signal fSel1b is the inverse of fine select signal fSel1. The third set of transistors includes NMOS transistors 871 and 872 and PMOS transistors 873 and 874. The gates of NMOS transistor 871 and PMOS transistor 874 are connected to the second delayed signal D2, the gate of NMOS transistor 872 is connected to the fine select signal fSel2, and the gate of PMOS transistor 873 is connected to the fine select signal fSel2b, where fine select signal fSel2b is the inverse of fine select signal tSel2. The drains of NMOS transistors 852, 862, 872, 853, 863, and 873 are connected to the multiplexer output Out.

The fine select signals fSel2-fSel0 for i-th inverting multiplexer (e.g., inverting multiplexers 841-844) are derived from the fine adjustment control signal fAdj<i> as shown in Table 5, below.

TABLE 5

| fAdj<i> | fSel2 | fSel2b | fSel1 | fSel1b | fSel0 | fSel0b | Output selected by multiplexer i |
| --- | --- | --- | --- | --- | --- | --- | --- |
| 0 | 0 | 1 | 0 | 1 | 1 | 0 | In |
| 1 | 0 | 1 | 1 | 0 | 0 | 1 | D1 |
| 2 | 1 | 0 | 0 | 1 | 0 | 1 | D2 |

Accordingly, the first and second sets of transistors may be activated using fine select signals fSel0b, fSel0, fSel1b, and fSel1 in order to blend the input signal In and the first delayed signal D1. Likewise, the second and third sets of transistors may be activated using fine select signals fSel1b, fSel1, fSel2b, and fSel2 in order to blend the first delayed signal D1 and second delayed signal D2.

Notably, power consumption of the interpolator 340 drops and linearity of the interpolation improves when the LOW→HIGH and HIGH→LOW transitions of input signal In and first delayed signal D1 andior first delayed signal D1 and second delayed signal D2 are closely spaced in time. This requires a short delay time step $t_{step}$ in the coarse timing DAC 310, as discussed above.

Figure 9:
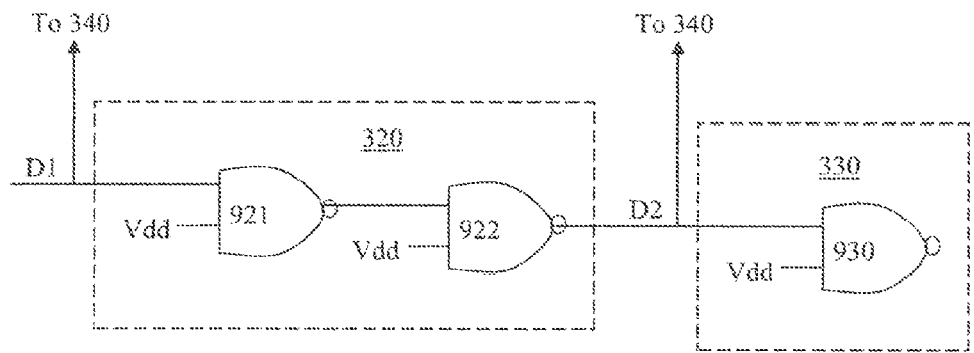
FIG. 9 is a block diagram illustrating a replica delay element and dummy load of the timing DAC of FIG. 3, according to a representative embodiment.

FIG. 9 is a block diagram illustrating a replica delay element 320 and a dummy load that may be incorporated in the timing DAC of FIG. 3, according to a representative embodiment.

Referring to FIG. 9, illustrative replica delay element 320 includes NAND gates 921 and 922. NAND gate 921 receives the first delayed signal D1 output by the coarse timing DAC 310 (which is also provided to the interpolator 340) and the supply voltage Vdd as inputs. NAND gate 922 receives the output of NAND gate 921 and the supply voltage Vdd as inputs, and outputs the second delayed signal D2, which incorporates a predetermined fixed delay. The second delayed signal D2, loaded by the dummy load 930, is provided to the interpolator 340. The replica delay element 320 mimics the LSB step size of the coarse timing DAC 310. Note that the capacitive loads are designed to be the same as in the coarse timing DAC 310. For example, when the coarse timing DAC 310 is implemented as coarse timing DAC 602 shown in FIG. 6, the capacitive load of both the coarse timing DAC 310 and the replica delay element 320 shown in FIG. 9 is the NAND gate capacitance.

Figure 10:
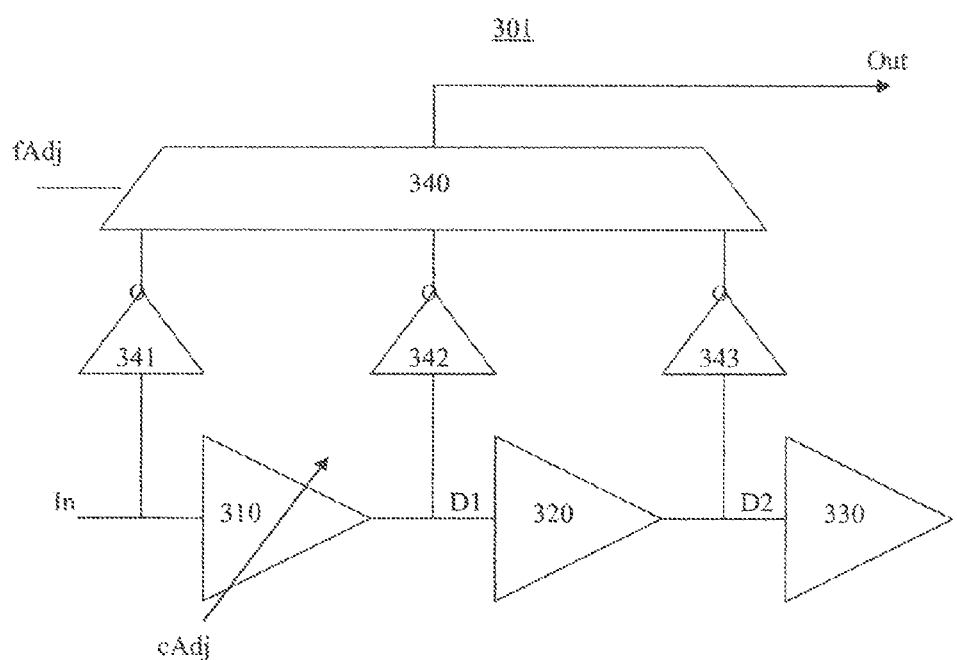
FIG. 10 is a block diagram illustrating a timing DAC, according to another representative embodiment.

FIG. 10 is a block diagram illustrating a timing DAC, according to another representative embodiment.

Referring to FIG. 10, timing DAC 311 is configured substantially the same as timing DAC 300, discussed above with reference to FIG. 3, with the addition of inverters 341, 342 and 343, which are connected to the first, second and third inputs of the interpolator 340, respectively. The inverter 341 buffers the input signal In, the inverter 342 buffers the first delayed signal D1 from the coarse timing DAC 310, and the inverter 343 buffers the second delayed signal D2 from the replica delay element 320, in order to drive the interpolator 340. The inverters 341-343 effectively ensure correct capacitive loads on the outputs of the coarse timing DAC 310 and the replica delay element 320. Of course, in the depicted embodiment, the interpolator 340 is configured to provide fine timing adjustments using inverted input signal In, inverted first delayed signal D1 and inverted second delayed signal D2, as would be apparent to one of ordinary skill in the art.

Figure 11:
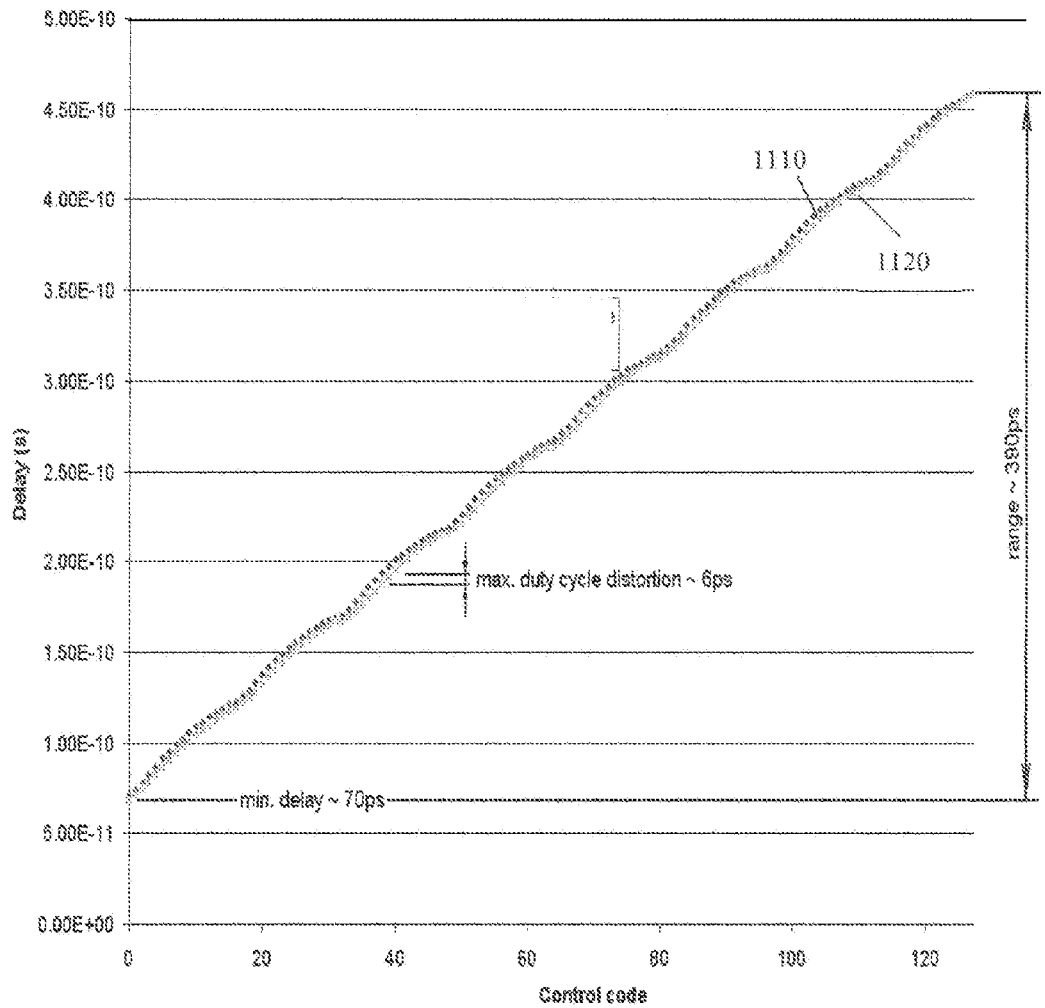
FIG. 11 is a graph showing simulation results of timing DAC operation, according to a representative embodiment.

FIG. 11 is a graph showing simulation results of timing DAC operation, according to a representative embodiment. In particular, FIG. 11 shows curves 1110 and 1120 derived from operation of the timing DAC 301 depicted in FIG. 10. Performance of the timing DAC 301 was evaluated in a 0.13 μm CMOS technology. The coarse timing DAC 310 had a resolution of 3 bits, and the interpolator 340 had a resolution of 4 bits, resulting in 7-bit overall resolution.

FIG. 11 shows the delay of the timing adjusted output signal Out of the timing DAC 301 as a function of digital control code for rising edges (curve 1110) and falling edges (curve 1120). The minimum delay at the low end of the range of the lowest delay setting (blend delay time $t_{blend}$) is about 70 ps and the entire tuning range is about 390 ps, which corresponds to more than a 6:1 ratio of maximum delay to minimum delay. The tuning range can be extended with almost no penalty to the minimum delay. The maximum duty cycle distortion of the timing DAC 301, which is the difference between the delays of the rising and falling transitions, is about 6 ps.

Various embodiments further include methods of adjusting timing of an input signal based on coarse and fine timing adjustments, e.g., using the coarse timing DAC 310 and the interpolator 340. For example, FIG. 12 is a flow diagram illustrating a method for adjusting timing of an input signal, according to a representative embodiment.

Figure 12:
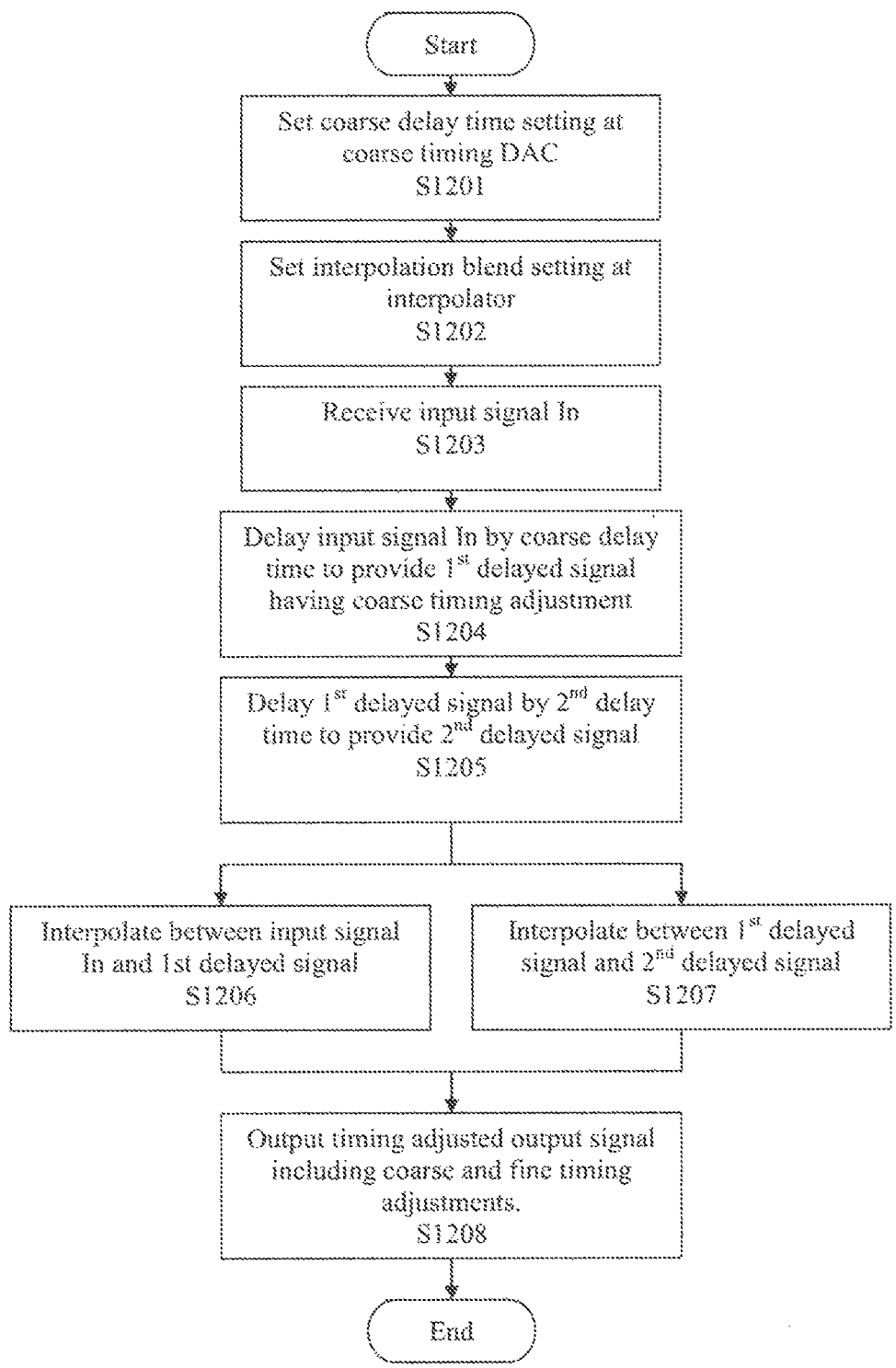
FIG. 12 is a flow diagram illustrating a method for adjusting timing of an input signal, according to a representative embodiment.

Referring to FIG. 12, the coarse delay time is set at coarse timing DAC 310 in block S1202, and the interpolation blend is set at interpolator 340 in block S1202. The input signal In is received (by timing DAC 300) in block S1203.

In block S1204, the received input signal In is delayed (using coarse timing DAC 310) by a coarse delay time to provide a first delayed signal D1, which includes the coarse timing adjustment. The coarse delay time may be implemented by selectively activating one or more delay elements in the coarse timing DAC 310, as discussed above with reference to FIGS. 1B, 5, 6 and 7. In block S1205, the first delayed signal D1 is delayed (using replica delay element 320) by second delay time to provide second delayed signal D2. Then, depending on the interpolation blend set in block S1202, interpolation is performed either between the input signal In and the first delayed signal in block S1206, or between the first delayed signal and the second delayed signal in block S1207. The fine delay time may be implemented by providing respective weighted strengths to the input signal In and the first delayed signal D1, or to the first and second delayed signals D1 and D2, in the interpolator 340, as discussed above with reference to FIGS. 8A and 8B. A timing adjusted output signal, which includes coarse timing adjustments from the coarse timing DAC 310 and/or the replica delay element 320 and fine timing adjustments from the interpolator 340, is output in block S1208.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. An apparatus for providing time adjustment of an input signal, the apparatus comprising:
   a coarse timing digital-to-analog converter (DAC) having a plurality of delay settings for providing a coarse timing adjustment of the input signal, the coarse timing DAC being configured to receive the input signal and to output a first delayed signal, the coarse timing DAC comprising one of: a plurality of NAND gates and inverters, and a trombone structure;
   a replica delay element configured to receive the first delayed signal from the coarse timing DAC and to provide a second delayed signal; and
   an interpolator configured to blend either the input signal and the first delayed signal or the first delayed signal and the second delayed signal to provide a fine timing adjustment of the input signal, wherein the interpolator is configured to provide a timing adjusted output signal comprising the coarse timing adjustment and the fine timing, adjustment.

2. The apparatus of claim 1, further comprising:
   a dummy load configured to load the second delayed signal from the replica delay element.

3. The apparatus of claim 1, further comprising:
   a first inverter connected between an input of the coarse timing DAC and a first input of the interpolator for receiving the input signal, the first inverter buffering the input signal;
   a second inverter connected between an output of the coarse timing DAC and a second input of the interpolator for receiving the first delayed signal, the second inverter buffering the first delayed signal; and
   a third inverter connected between an output of the replica delay element and a third input of the interpolator for receiving the second delayed signal, the third inverter buffering the second delayed signal.

4. The apparatus of claim 1, wherein the trombone structure comprises a plurality of two-input inverting multiplexers and a plurality of inverters, one input of each multiplexer being configured to receive an output of an inverting multiplexer from a stage.

5. The apparatus of claim 1, wherein each of the plurality of NAND gates is configured to provide equal rising and falling edge propagation delays for both inputs of the NAND gate.

6. The apparatus of claim 1, wherein the interpolator comprises a plurality of inverting multiplexers, each multiplexer being configured to receive the input signal, the first delayed signal and the second delayed signal, and to blend the first delayed signal with one of the input signal or the second delayed signal according to a variable ratio.

7. The apparatus of claim 6, wherein outputs of the plurality of inverting multiplexers are shorted together to provide the timing adjusted output signal output by the interpolator.

8. The apparatus of claim 1, wherein the plurality of delay settings of the coarse timing DAC are separated an incremental delay time step.

9. The apparatus of claim 8, wherein the coarse timing DAC includes a minimum delay setting, a maximum delay setting and at least one intermediate delay setting.

10. The apparatus of claim 9, wherein when the coarse timing DAC is set to the minimum delay setting and the interpolator is set to blend the input signal and the first delayed signal, delays range from a blend delay time required by the interpolator to a sum of the blend delay time and a minimum delay time corresponding to the minimum delay setting.

11. The apparatus of claim 9, wherein when the coarse timing DAC is set to the minimum delay setting and the interpolator is set to blend the first delayed signal and the second delayed signal, delays range from a sum of a blend delay time required by the interpolator and a minimum delay time to a sum of the blend delay time, the minimum delay time and the delay time step.

12. The apparatus of claim 9, wherein when the coarse timing DAC is set to the minimum delay setting plus k times the at least one intermediate delay setting, where k is an integer, and the interpolator is set to blend the first delayed signal and the second delayed signal, delays range from a sum of a blend delay time required by the interpolator, the minimum delay time and k times the delay time step to a sum of the blend delay time, the minimum delay time and (k+1) times the delay time step.

13. A method for providing time adjustment of an input signal, the method comprising:
   delaying the input signal by a first delay time to provide a first delayed signal including a coarse timing adjustment of the input signal, the first delay time being selectable from among a plurality of delay settings, the plurality of delay settings comprising, a minimum delay setting, a maximum delay setting, and at least one intermediate delay setting, the at least one intermediate delay setting;
delaying the first delayed signal by a predetermined second delay time to provide a second delayed signal;
interpolating between either the input signal and the first delayed signal or between the first delayed signal and the second delayed signal to provide a fine timing adjustment of the input signal; and
outputting a timing adjusted output signal including the coarse timing adjustment and the fine timing adjustment.

14. The method of claim 13, wherein a first intermediate delay setting of the at least one intermediate delay setting is separated from the minimum delay setting by an incremental delay time, and the maximum delay setting is separated from a last intermediate delay setting of the at least one intermediate delu setting by the incremental delay time.

15. An apparatus for providing time adjustment of an input signal, the apparatus comprising:
an coarse timing digital-to-analog converter (DAC) having predetermined minimum delay setting, and a plurality of intermediate delay settings, each intermediate delay setting being separated from a previous delay setting by an incremental delay time, the coarse timing DAC being configured to receive the input signal and to output a first delayed signal by delaying the input signal by a coarse delay time corresponding to a selected delay comprising one of the minimum delay setting or the minimum delay setting plus at least one of the plurality of intermediate delay settings;
a replica delay element configured to receive the first delayed signal from the coarse timing DAC and to output a second delayed signal by delaying the first delayed signal by the incremental delay time; and
an interpolator configured to interpolate between either the input signal and the first delayed signal or between the first delayed signal and the second delayed signal to provide a fine timing adjustment of the input signal, the interpolator outputting a timing adjusted output signal including the coarse timing adjustment and the fine timing adjustment, wherein the interpolator comprises a plurality of inverting multiplexers, the inverting multiplexers having corresponding weighted drive strengths, which are selectively applied in response to a fine adjustment control word.

16. The apparatus of claim 15, wherein the coarse timing DAC comprises a plurality of delay elements at least one of which is selectively activated in response to a coarse adjustment control word.

17. An apparatus for providing time adjustment of an input signal, the apparatus comprising:
a coarse timing digital-to-analog converter (DAC) having a plurality of delay settings for providing a coarse timing adjustment of the input signal, the coarse timing DAC being configured to receive the input signal and to output a first delayed signal;
a replica delay element configured to receive the first delayed signal from the coarse timing DAC and to provide a second delayed signal; and
an interpolator configured to blend either the input signal and the first delayed signal or the first delayed signal and the second delayed signal to provide a fine timing adjustment of the input signal, wherein the interpolator is configured to provide a timing adjusted output signal comprising the coarse timing adjustment and the fine timing adjustment.

* * * * *